United States Patent
Ho et al.

(10) Patent No.: US 7,401,725 B2
(45) Date of Patent: Jul. 22, 2008

(54) SYSTEM AND METHOD FOR IMPROVING HARD DRIVE ACTUATOR LEAD ATTACHMENT

(75) Inventors: Yiu Sing Ho, Ma On Shan Shatin, N. T. (HK); Guo Hong Lu, Dongguan (CN); Can Hua Chen, Dongguan (CN); Yuan Neng Luo, Dongguan (CN); Jeffrey L. Wang, Tai Po, N.T. (HK); Liu Jun Zhang, Dongguan (CN)

(73) Assignee: SAE Magnetics (H.K.) Ltd., Shatin, N.T. (HK)

( * ) Notice: Subject to any disclaimer, the term of this patent is extended or adjusted under 35 U.S.C. 154(b) by 318 days.

(21) Appl. No.: 10/741,139

(22) Filed: Dec. 19, 2003

(65) Prior Publication Data

US 2004/0200889 A1    Oct. 14, 2004

(30) Foreign Application Priority Data

Apr. 11, 2003    (WO) .................... PCT/CN03/00256

(51) Int. Cl.
*B23K 31/00*    (2006.01)
(52) U.S. Cl. ................... 228/248.1; 29/603.03
(58) Field of Classification Search .............. 228/248.1; 29/603.03, 603.06; 360/264.2, 266.1, 97.01
See application file for complete search history.

(56) References Cited

U.S. PATENT DOCUMENTS

| | | | |
|---|---|---|---|
| 4,740,657 A | 4/1988 | Tsukagoshi et al. | 174/88 R |
| 4,835,429 A | 5/1989 | Kuno et al. | 310/71 |
| 4,970,365 A | 11/1990 | Chalco | 219/121.63 |
| 5,298,715 A | 3/1994 | Chalco et al. | 219/121.64 |
| 5,304,460 A | 4/1994 | Fulton et al. | 430/311 |
| 5,528,091 A | 6/1996 | Loubier et al. | 310/13 |
| 5,734,523 A | 3/1998 | Scheidecker et al. | 360/103 |
| 5,734,528 A | 3/1998 | Jabbari et al. | 360/106 |
| 5,783,465 A * | 7/1998 | Canning et al. | 439/119 |
| 6,034,843 A | 3/2000 | Tsujino et al. | 360/106 |
| 6,036,813 A | 3/2000 | Schulz et al. | 156/307.7 |
| 6,185,075 B1 * | 2/2001 | Tsujino et al. | 360/265.7 |

OTHER PUBLICATIONS

*3M Technical Bulletin*, "Notes on 3M™ Z-Axis Adhesive Film 7303 Bonding Sequence", Mar. 1999; pp. 1-4.
*3M* "Z-Axis Adhesive Film (ZAF) 7303", Technical Data, Apr. 1999; pp. 1-4.
*3M Technical Bulletin*, "Notes on Thermocompressin Bonder Set-Up for 3M™ Z-Axis Bonding Film", May 1999; pp. 1-6.
*3M Technical Bulletin*, "Visual Inspection Guide for 3M™ 7303 Z-Axis Film", Mar. 2000; pp. 1-4.
*3M Technical Bulletin*, "Reliability Test Results for 3M™ Z-Axis Film 7303", May 2000; pp. 1-4.

* cited by examiner

*Primary Examiner*—Kevin P. Kerns
(74) *Attorney, Agent, or Firm*—Kenyon & Kenyon LLP

(57) ABSTRACT

A system and method are disclosed for improving hard drive actuator lead attachment. In one embodiment, an actuator board is coupled to an actuator flexible cable by a bonding agent, such as an anisotropic conductive film (ACF). In one embodiment, an actuator flexible cable is coupled to one or more actuator coil leads, such as by solder bump bonding, and the flexible cable/actuator coil coupling is embedded in an actuator frame, such as by polymer injection molding.

4 Claims, 11 Drawing Sheets

SYSTEM AND METHOD FOR IMPROVING HARD DRIVE ACTUATOR LEAD ATTACHMENT

BACKGROUND INFORMATION

The present invention relates to hard disk drives. More specifically, the invention relates to a system and method for improving the electrical connection of a hard drive actuator coil lead.

FIG. 1 provides an illustration of a typical hard disk drive. Hard disk drive storage devices typically include a rotating disk 10 mounted for rotation by a spindle motor. The slider 1 is attached via a flexure to a load beam 2 supported by an actuator arm 3. The slider 1 'flies' over the surface of the magnetic disk 10 at a high velocity reading data from and writing data to concentric data tracks on the disk 10. The head/slider 1 is positioned radially by an actuator 20, comprising an actuator coil 13 housed in an actuator frame 8.

In typical hard disk drives, electrical control signals are communicated to the voice coil motor (actuator 20) by a head stack assembly (HSA) flexible circuit 9. Typically, the HSA flexible circuit 9 also communicates read/write data to the head(s) 1. The flexible circuit 9 attaches to the actuator coil 13 via an actuator board 7, containing a preamplifier chip 11 (mounted to the actuator arm 3).

FIG. 2 provides a more detailed view of a hard disk drive arm as is typical in the art. The actuator board 7 is usually electrically coupled to the actuator coil 13 by one or more actuator coil leads 18 attached typically by soldering or ultrasonic bonding 20. It can be difficult to get a good solder bond on non-rigid surfaces, such as on a polymer substrate, and thus, solderless bonding techniques, such as in U.S. Pat. No. 4,970,365 and U.S. Pat. No. 5,298,715, have been suggested. Further, removing adhesive or solder flux contamination presents a problem (as described below) necessitating solderless bonding techniques.

FIG. 3 illustrates a typical technique of solderless lead bonding as provided by U.S. Pat. No. 4,970,365. A laser/ultrasonic-assisted thermal compression technique is utilized where laser (or ultrasonic) energy is used for attaching fine pitch components to non-rigid substrates. Typically, the laser/ultrasonic energy is used to pulse heat a fine-point capillary tip 22, placed in forced intimate contact with a lead 16 and pad 14.

There are disadvantages associated with the above method of bonding. For example, such methods provide poor bonding strength, and thus, the reliability and durability of such bonds are lacking. A bond defect can cause degraded performance or failure of the head stack assembly. The nature of this type of bonding prevents rework or salvage of the bonded components. Further, laser/ultrasonic-assisted thermal compression techniques require costly, high precision equipment. Also, cleaning flux, which is necessary for effective soldering is difficult and costly. Further, solder, which consists primarily of tin, can cause component contamination. During soldering, such as soldering coil leads 18 to the connection pads on an actuator board 7 (See FIG. 2), tin may splash out causing damage to surrounding electrical components and/or disk media.

It is therefore desirable to have a system and method for improving the electrical connection of the hard drive actuator coil that avoids the above-mentioned problems, as well as having additional benefits.

DETAILED DESCRIPTION

Figure 1:
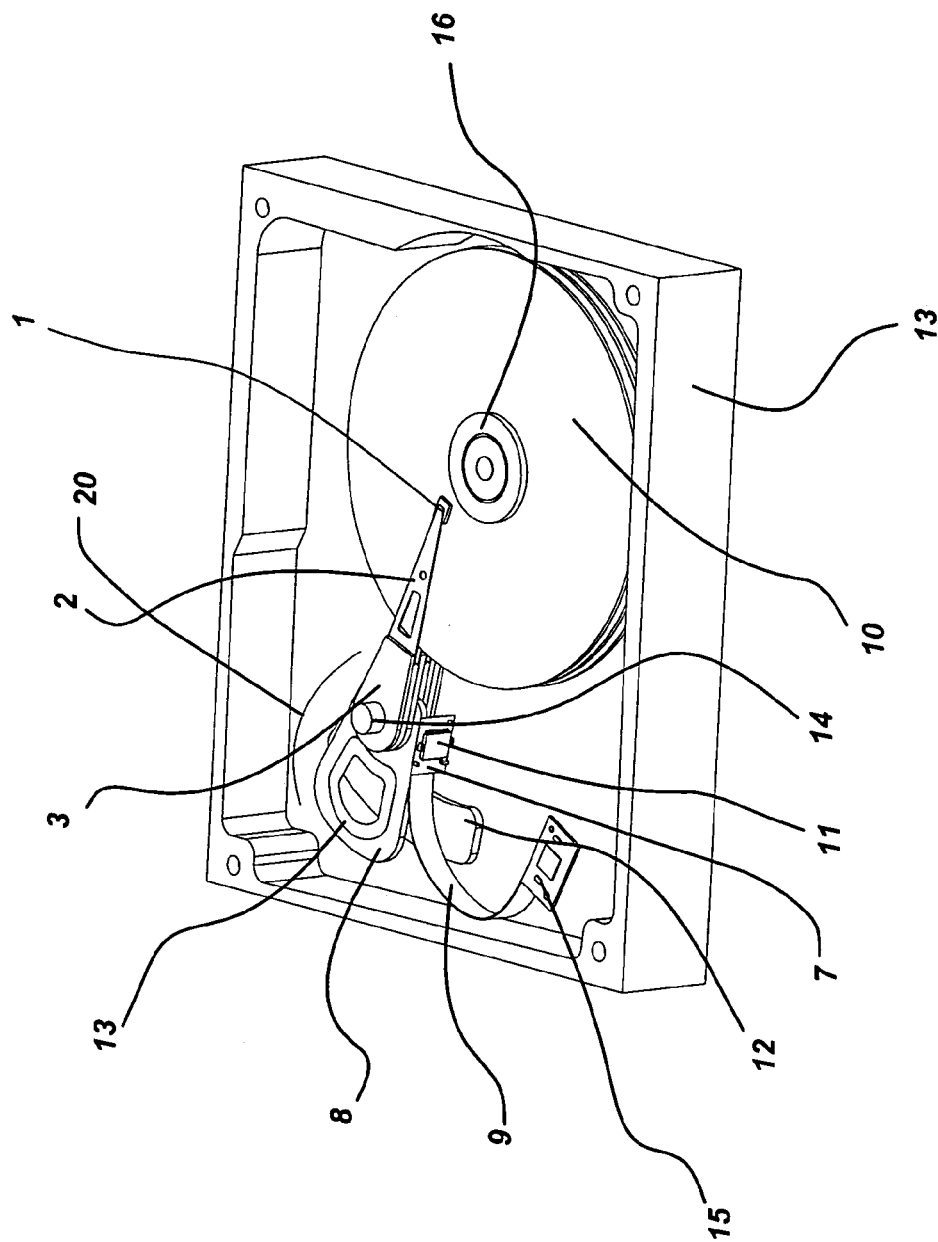
FIG. 1 provides an illustration of a typical hard disk drive.
Figure 2:
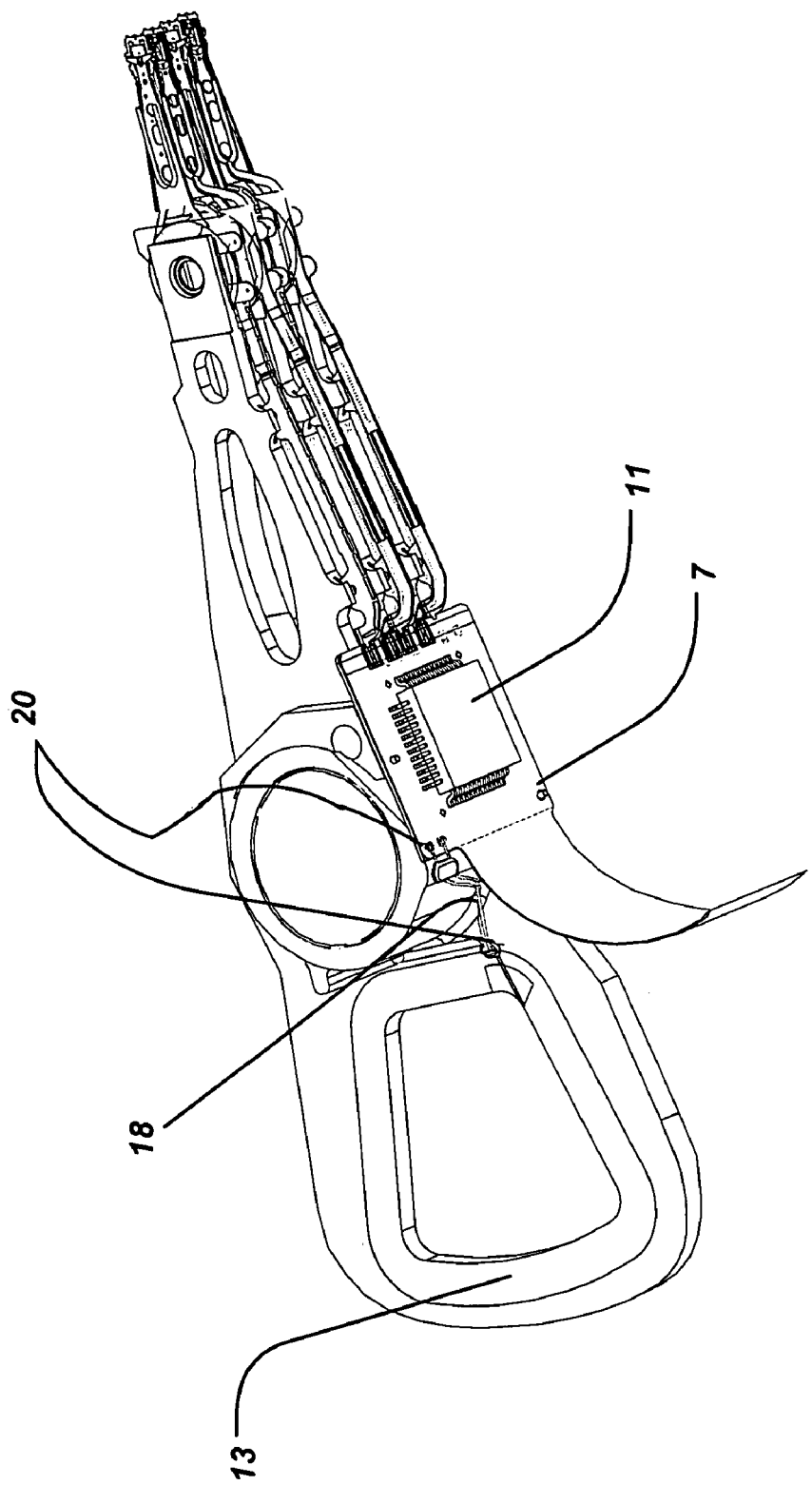
FIG. 2 provides a more detailed view of a hard disk drive arm as is typical in the art.
Figure 3:
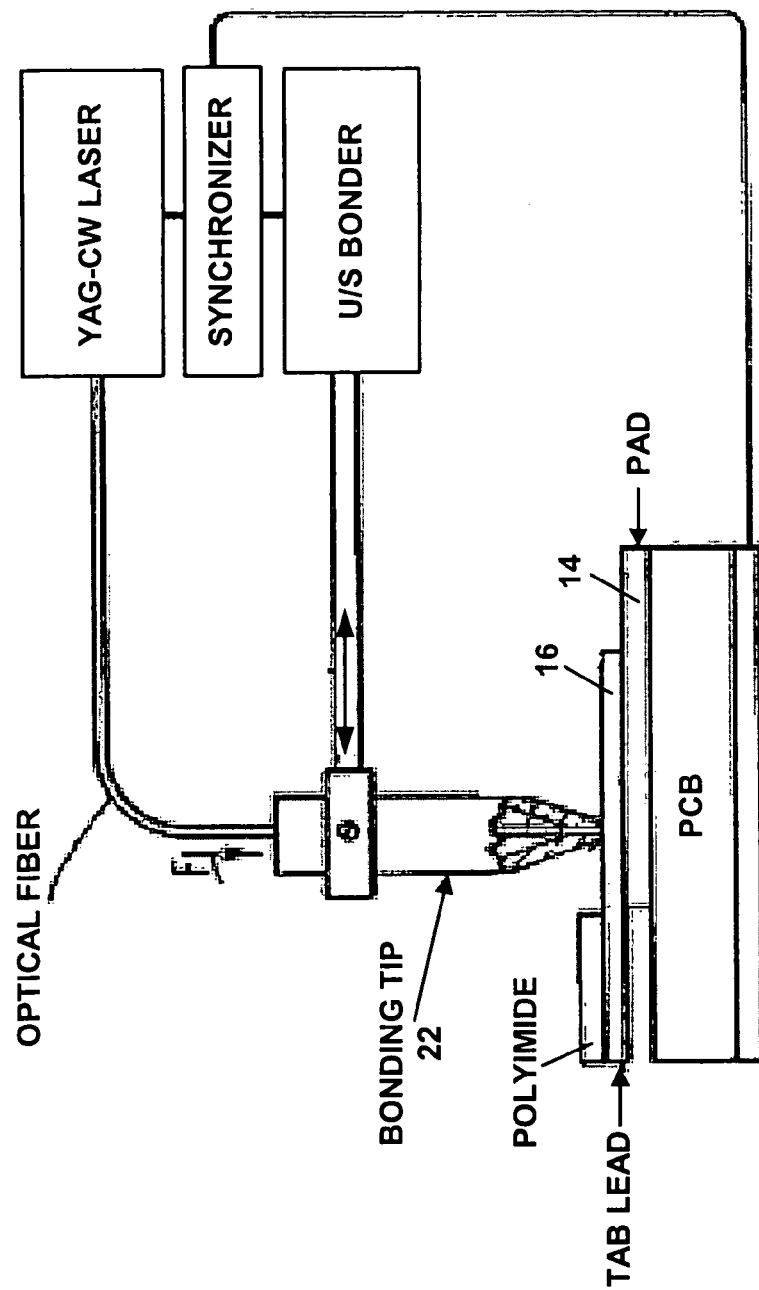
FIG. 3 illustrates a typical technique of solderless lead bonding as known in the art.
Figure 4:
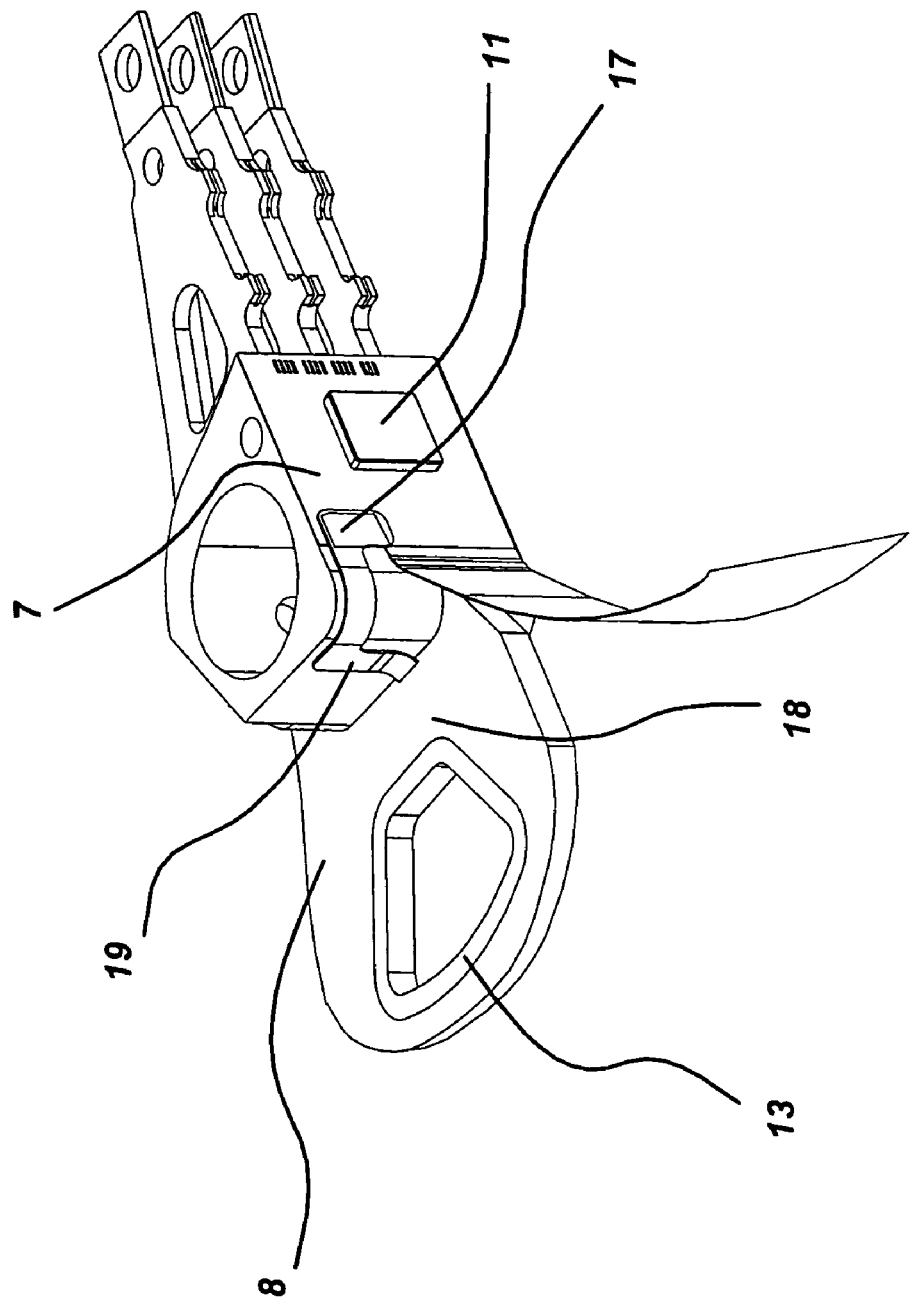
FIG. 4 illustrates the attachment of a hard disk drive actuator board to an actuator coil according to an embodiment of the present invention.

FIG. 4 illustrates the attachment of a hard disk drive actuator board to an actuator coil according to an embodiment of the present invention. In one embodiment, a flexible cable 19 (relay flexible cable) is utilized to attach the actuator board 7 to the actuator coil 13. In this embodiment, Anisotropic Conductive Film (ACF) is used to couple the flexible cable 19 to the actuator board 7, as explained further below.

Figure 5:
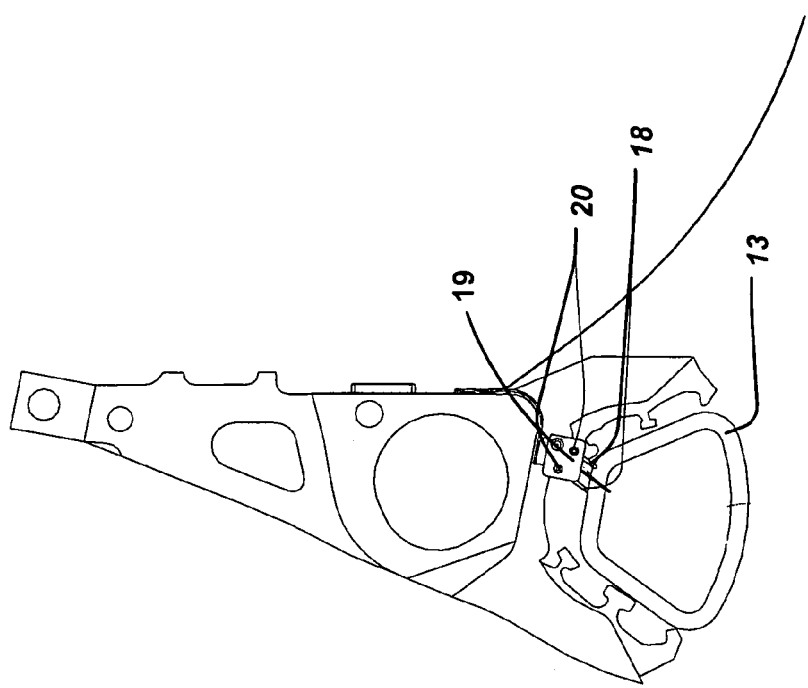
FIG. 5 provides a different perspective of the attachment of a hard drive actuator board to an actuator coil according to an embodiment of the present invention.

FIG. 5 provides a different perspective of the attachment of a hard drive actuator board to an actuator coil according to an embodiment of the present invention. In one embodiment, the flexible cable 19 (relay flexible cable) is attached to the actuator coil 13 via actuator leads 18, bonded to the flexible cable 19, such as by solder bump bonding 20. Further in an embodiment, the coupling is encased in a polymer actuator frame. (See FIGS. 10 and 11).

Figure 6:
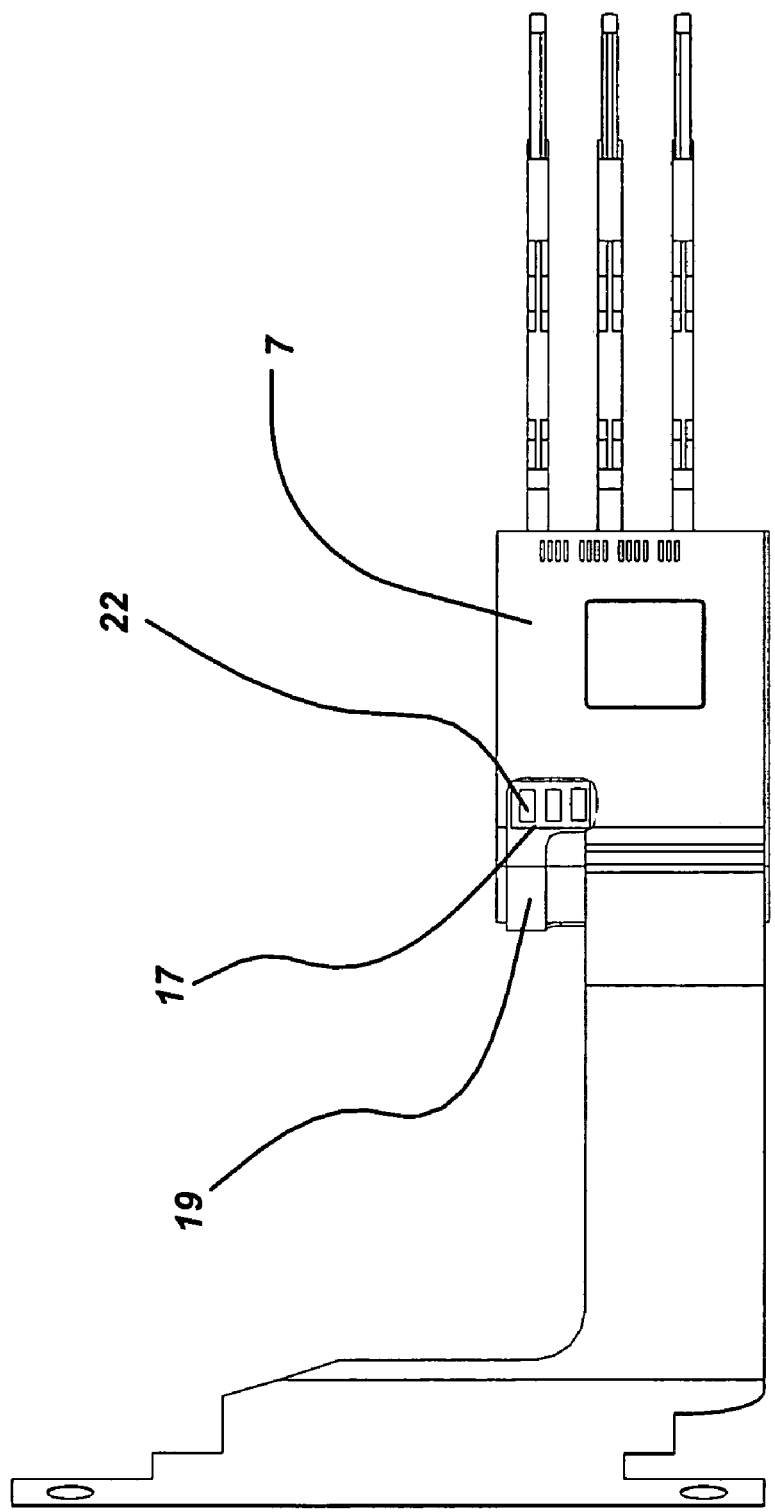
FIG. 6 illustrates the attachment of a hard disk drive actuator board to an actuator coil flexible cable according to an embodiment of the present invention.

FIG. 6 illustrates the attachment of a hard disk drive actuator board to an actuator coil flexible cable according to an embodiment of the present invention. As stated above, in one embodiment, ACF 17 is utilized to electrically bond the actuator board 7 to the flexible cable 19. (See also FIG. 7).

Figure 7:
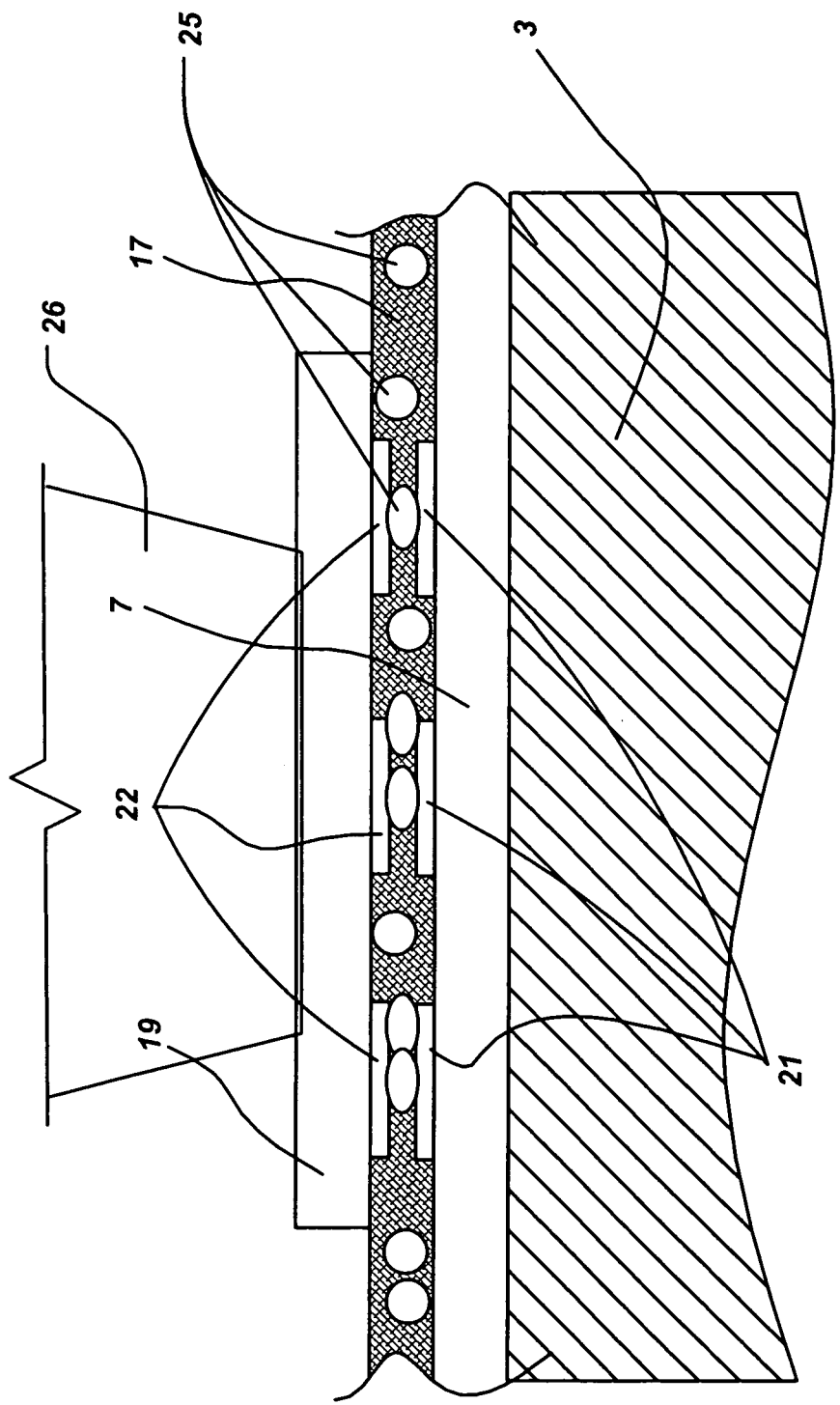
FIG. 7 provides a more detailed illustration of the attachment of a hard disk drive actuator board to an actuator coil flexible cable according to an embodiment of the present invention.

FIG. 7 provides a more detailed illustration of the attachment of a hard disk drive actuator board to an actuator coil flexible cable according to an embodiment of the present invention. In one embodiment, a layer of a bonding agent 17, such as ACF (Anisotropic Conductive Film), is sandwiched between electrical contact pads 21 of the actuator board 7 and electrical contact pads 22 of the flexible cable 19. ACF 17, such as 3M™ 7303 Z-Axis Film, is a film of adhesive material containing conductive particles 25, such as silver-coated glass spheres 0.035 millimeters in diameter. In one embodiment of the present invention, a heated bonding tip 26 is pressed to the flexible cable to compress the bonding agent 17

(e.g., the ACF) between the actuator board 7 and the flexible cable 19. In this embodiment, upon compression a number of conductive particles 25 are wedged and embedded between the pads 21 of the actuator board 7 and pads 22 of the flexible cable 19, forming discrete electrical pathways between the pads 21, 22 facing one another. In this embodiment, the bonding tip 26 is maintained applying pressure and heat to the bonding agent 17 (through the flexible cable 19) for a predetermined amount of time (e.g., 20 to 30 seconds) and at a predetermined temperature (e.g., 200°Celcius) to cure the adhesive in the bonding agent 17 and to bond the conductive particles 25 to the pads 21, 22. Further, because a bonding agent 17 such as ACF can be pre-tacked into position before permanently bonding (because the bonding agent is tacky), there is less likelihood of incorrect positioning.

Figure 8:
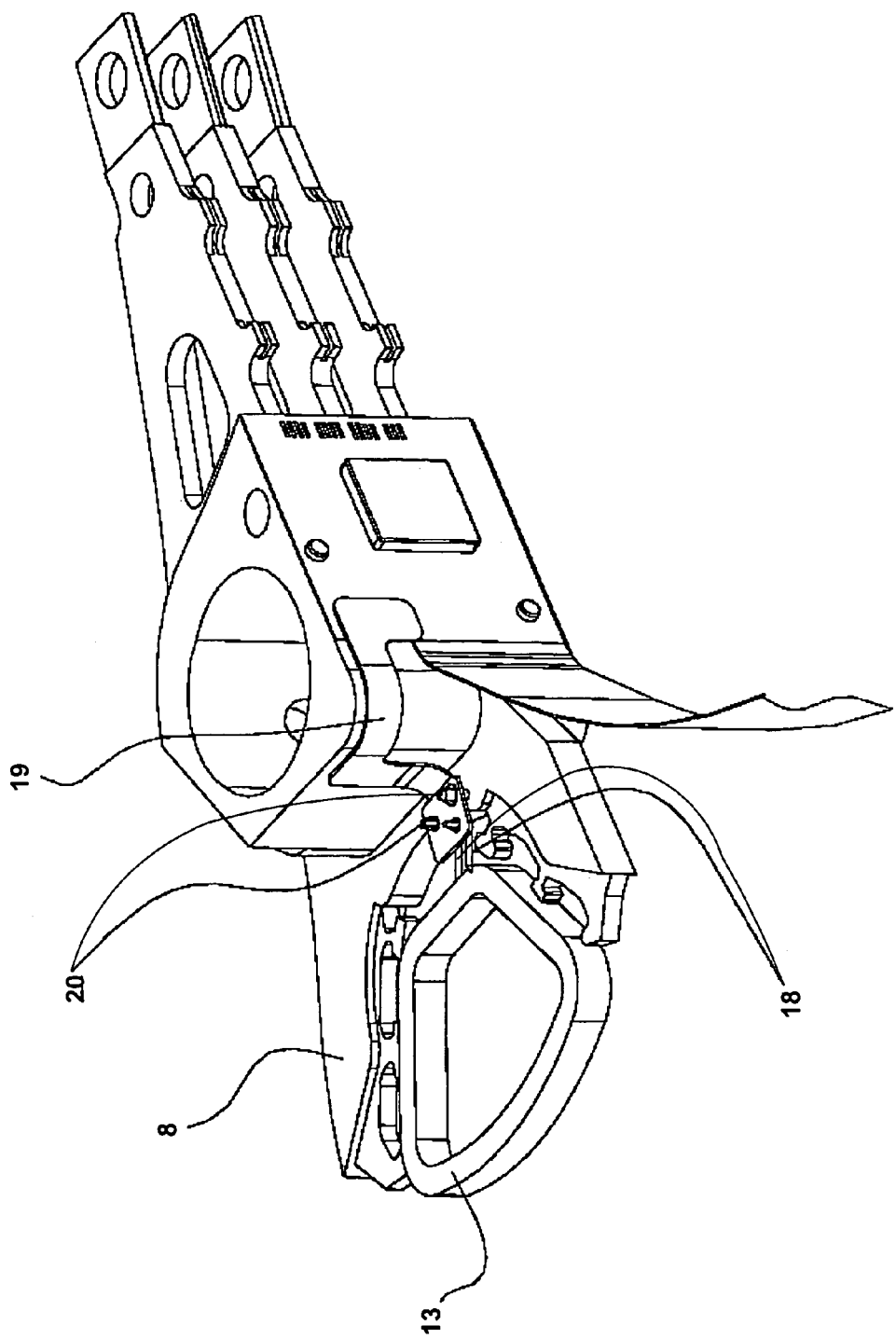
FIG. 8 provides another illustration of the attachment of an actuator coil to a flexible cable according to principles of the present invention.

FIG. 8 provides another illustration of the attachment of an actuator coil to a flexible cable according to principles of the present invention. In one embodiment, solder bump bonding 20 is utilized to electrically couple one or more actuator leads 18 of the actuator coil 13 to the flexible cable 19. After attachment, the coupling is embedded in a polymer actuator frame 8, such as by injection molding. (See FIGS. 9, 10 and 11).

Figure 9:
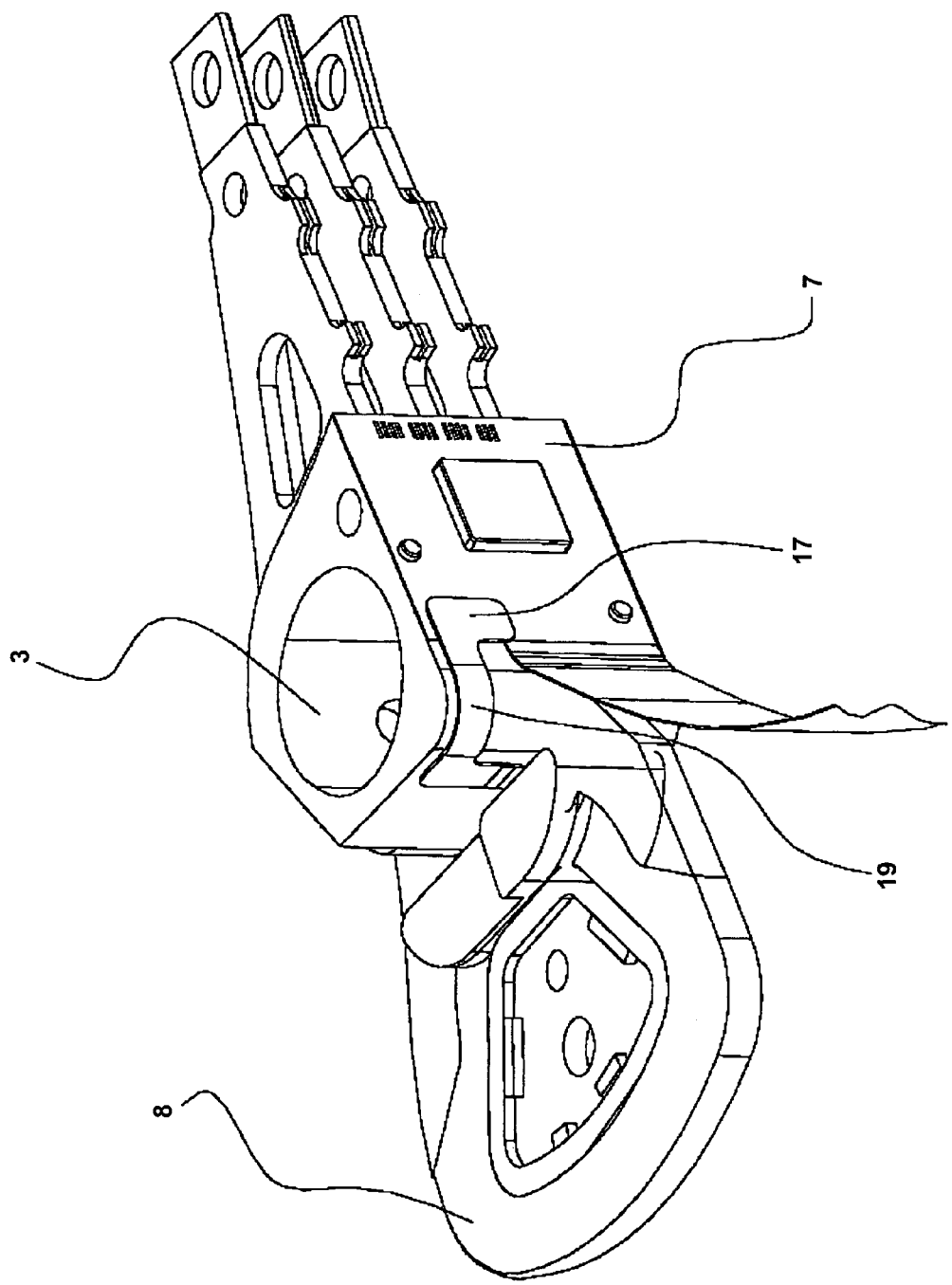
FIG. 9 provides another illustration of the attachment of an actuator coil to an actuator board via a flexible cable according to an embodiment of the present invention.

FIG. 9 provides another illustration of the attachment of an actuator coil to an actuator board via a flexible cable according to an embodiment of the present invention. In one embodiment, a portion of the actuator coil (not shown) and the actuator coil/flexible cable 19 coupling is enclosed in a mold (not shown). In this embodiment, the mold is then injected with a material such as polymer to form an actuator frame 8. In this embodiment, the mold is then removed, leaving the polymer frame 8, which protects the electrical connections from outside contamination.

Figure 10:
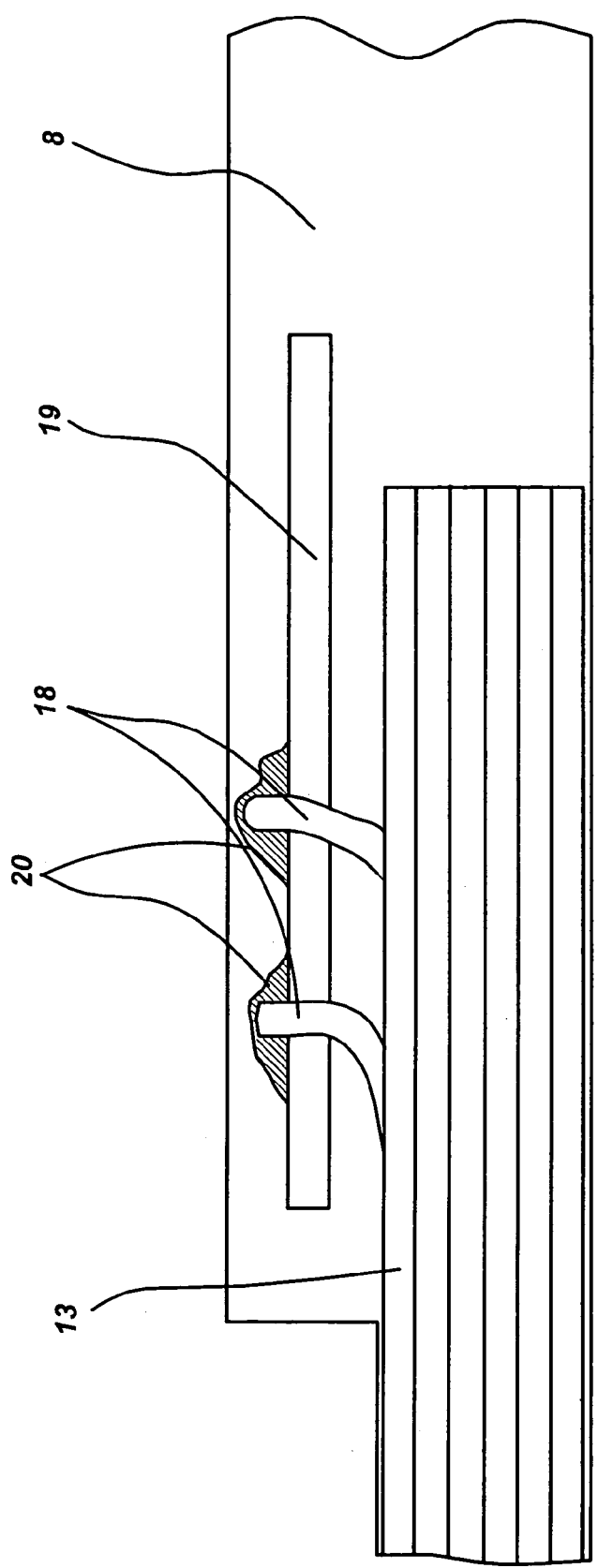
FIG. 10 provides a further illustration of actuator coil/actuator board attachment via a flexible cable according to an embodiment of the present invention.

FIG. 10 provides a further illustration of actuator coil/actuator board attachment via a flexible cable according to an embodiment of the present invention. As explained above, in one embodiment, a portion of the actuator coil 13 and the actuator coil/flexible cable 19 coupling is enclosed in a polymer actuator frame 8.

Figure 11:
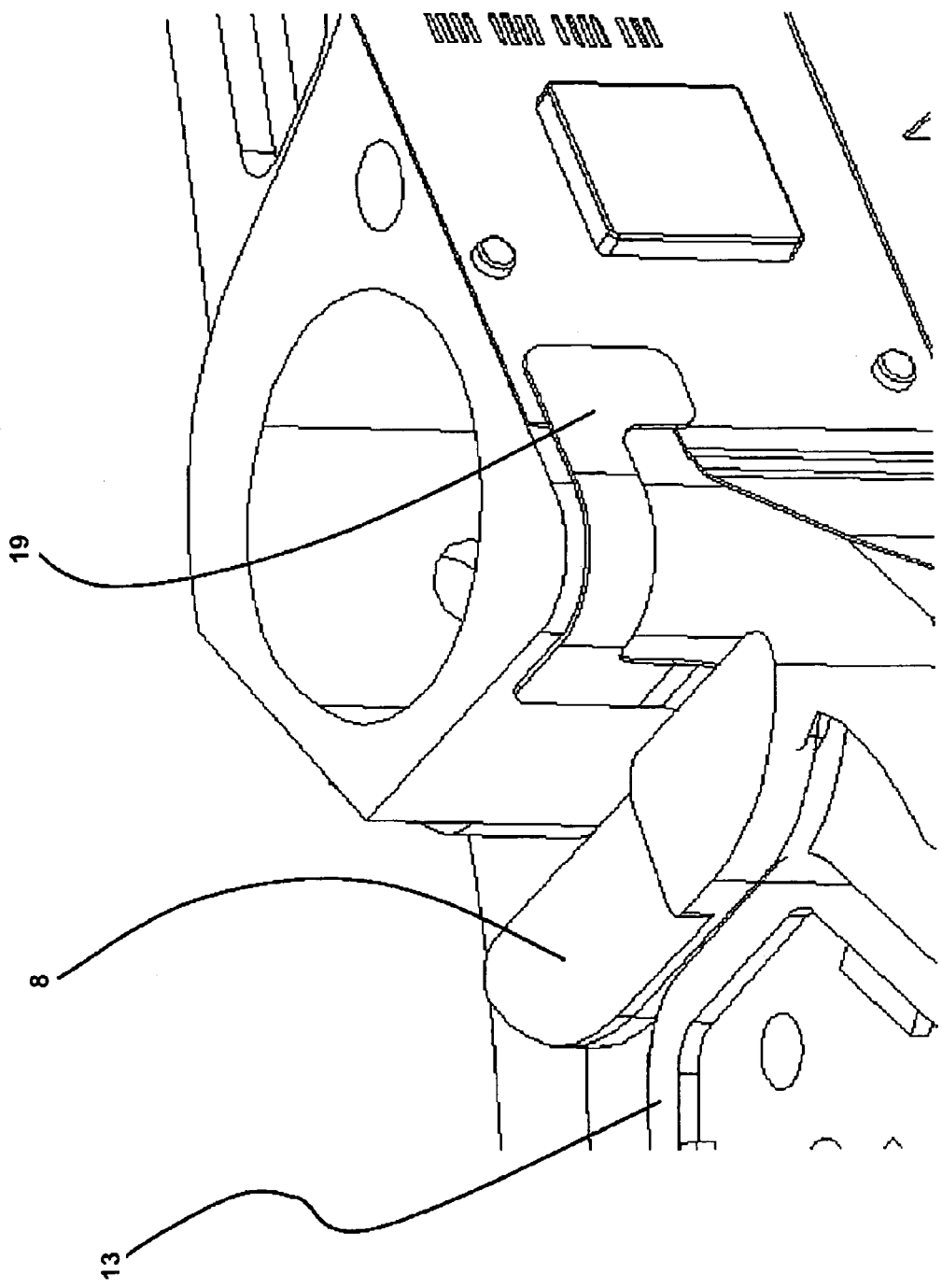
FIG. 11 provides a photograph of actuator coil/actuator board attachment via a flexible cable according to an embodiment of the present invention.

FIG. 11 provides a photograph of actuator coil/actuator board attachment via a flexible cable according to an embodiment of the present invention. As explained, in this embodiment, a portion of the actuator coil 13 and the actuator coil/flexible cable 19 coupling is enclosed in a polymer actuator frame 8.

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A method for manufacturing a hard disc drive arm comprising:
   coupling an electrical lead of a hard drive actuator coil to a flexible cable pad of a flexible cable element to form a coupling; and
   enclosing in a polymer frame at least a portion of said coupling.

2. The method bf claim 1, wherein said electrical lead is to be coupled to said flexible cable pad by solder bonding.

3. A method for manufacturing a hard disc drive arm comprising:
   coupling a hard drive actuator board, having at least one actuator pad, to a flexible cable element, having at least one flexible cable pad, by a bonding agent, said bonding agent including a plurality of electrically conductive particles;
   compressing said bonding agent between said actuator board and said flexible cable element; and
   forming by a number of said particles an electrical path between said actuator pad and said flexible cable pad,
   wherein the flexible cable element couples the hard drive actuator board to an actuator coil of the hard disc drive.

4. The method of claim 3, wherein said hard drive actuator board is to be coupled to said flexible cable element by applying pressure to said flexible cable element by a bonding tip to compress said bonding agent between said actuator board and said flexible cable element.

* * * * *